(12) United States Patent
Kitamura (10) Patent No.: US 8,405,472 B2
(45) Date of Patent: Mar. 26, 2013

(54) ELASTIC WAVE FILTER DEVICE

(75) Inventor: Hidekazu Kitamura, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 305 days.

(21) Appl. No.: 12/910,987

(22) Filed: Oct. 25, 2010

(65) Prior Publication Data

US 2011/0037535 A1 Feb. 17, 2011

Related U.S. Application Data

(63) Continuation of application No. PCT/JP2009/001831, filed on Apr. 22, 2009.

(30) Foreign Application Priority Data

May 7, 2008 (JP) .................................. 2008-121254

(51) Int. Cl.
*H03H 9/72* (2006.01)
*H03H 9/64* (2006.01)

(52) U.S. Cl. ..................... 333/133; 333/193; 333/195

(58) Field of Classification Search .................. 333/133, 333/187–196; 455/78, 82, 83
See application file for complete search history.

(56) References Cited

U.S. PATENT DOCUMENTS

| | | | |
|---|---|---|---|
| 6,489,860 B1 | 12/2002 | Ohashi | |
| 7,155,197 B2 * | 12/2006 | Furutani | 455/349 |
| 7,253,702 B2 * | 8/2007 | Kemmochi et al. | 333/133 |
| 7,525,407 B2 * | 4/2009 | Lee et al. | 336/200 |
| 2003/0058066 A1 | 3/2003 | Taniguchi et al. | |
| 2003/0214368 A1 | 11/2003 | Taniguchi | |
| 2006/0139125 A1 | 6/2006 | Shiga-ken et al. | |
| 2008/0061906 A1 * | 3/2008 | Omura et al. | 333/133 |
| 2008/0096516 A1 * | 4/2008 | Mun et al. | 455/341 |

FOREIGN PATENT DOCUMENTS

| | | |
|---|---|---|
| JP | 2001-339273 A | 12/2001 |
| JP | 2002-141771 A | 5/2002 |
| JP | 2003-332885 A | 11/2003 |
| WO | 2005/055423 A1 | 6/2005 |
| WO | 2006/040927 A1 | 4/2006 |
| WO | 2008/029641 A1 | 3/2008 |

OTHER PUBLICATIONS

Official Communication issued in corresponding Japanese Patent Application No. 2010-511000, mailed on Jun. 12, 2012.
Official Communication issued in International Patent Application No. PCT/JP2009/001831, mailed on Jun. 23, 2009.

* cited by examiner

*Primary Examiner* — Barbara Summons
(74) *Attorney, Agent, or Firm* — Keating & Bennett, LLP (57) ABSTRACT

An elastic wave filter device includes first and second inductance elements included in a laminated substrate and first and second elastic wave filter chips mounted on the laminated substrate by flip-chip bonding. The first and second inductance elements provided in the laminated substrate include first and second coil patterns, respectively, which are provided in a plane located at a certain height level in the laminated substrate. The second coil pattern is arranged in a region in which the first coil pattern is provided.

5 Claims, 6 Drawing Sheets

ELASTIC WAVE FILTER DEVICE

BACKGROUND OF THE INVENTION

1. Field of the Invention

The present invention relates to elastic wave filter devices used for band-pass filters, duplexers, or other devices, and more particularly, to an elastic wave filter device including an elastic wave filter chip that is mounted, by flip-chip bonding, on a laminated substrate in which inductance elements are included.

2. Description of the Related Art

Figures 7, 8:
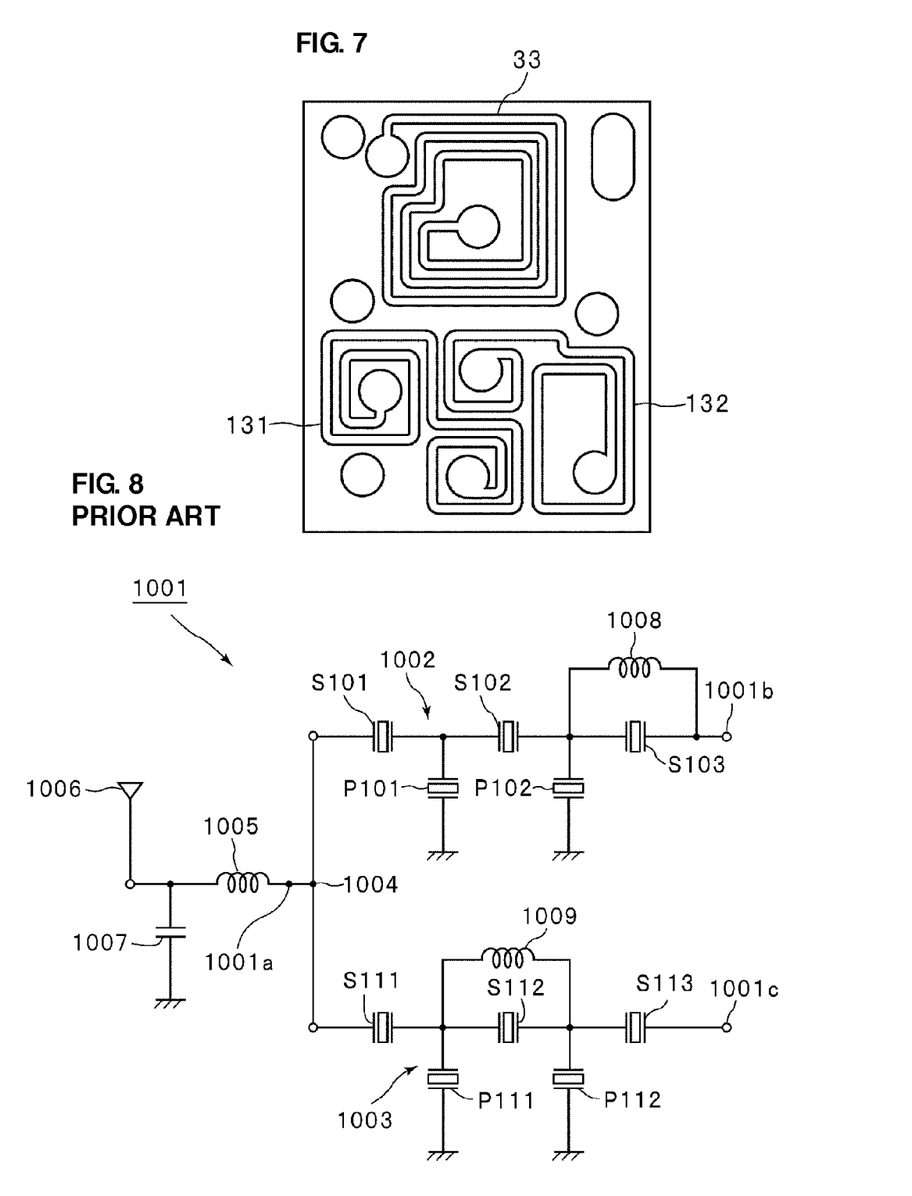
FIG. 7 is a schematic plan view of a portion in which first to third coil patterns are provided in an elastic wave filter device of a comparative example in which the first and second coil patterns are provided in the same manner as in an example of the related art.
FIG. 8 is a circuit diagram for explaining the circuit configuration of a duplexer of the related art.

Duplexers have been used for the RF stage of cellular phones or other communication devices in order to reduce the overall size of the device. In Japanese Unexamined Patent Application Publication No. 2003-332885, for example, a duplexer having a circuit configuration shown in FIG. 8 is disclosed. As illustrated in FIG. 8, a duplexer 1001 includes a reception side band-pass filter 1002 and a transmission side band-pass filter 1003 for a cellular phone. The reception side band-pass filter 1002 is a ladder filter including series-arm resonators S101 to S103 and parallel-arm resonators P101 and P102.

The transmission side band-pass filter 1003 is a ladder filter including series-arm resonators S111 to S113 and parallel-arm resonators P111 and P112. The reception side band-pass filter 1002 and the transmission side band-pass filter 1003 are each defined by an elastic wave filter chip. One end of the reception side band-pass filter 1002 and one end of the transmission side band-pass filter 1003 are commonly connected to a node 1004. The node 1004 is connected to an antenna 1006 through an inductance element 1005. In addition, a capacitor 1007 is connected between a node between the antenna 1006 and the inductance element 1005 and a ground potential.

In the reception side band-pass filter 1002, an inductance element 1008 is connected in parallel with the series-arm resonator 103. In contrast, in the transmission side band-pass filter 1003, an inductance element 1009 is connected in parallel with the series-arm resonator S112.

The duplexer 1001 includes an input terminal 1001a connected to the antenna 1006, a reception terminal 1001b, and a transmission terminal 1001c.

Figure 9:
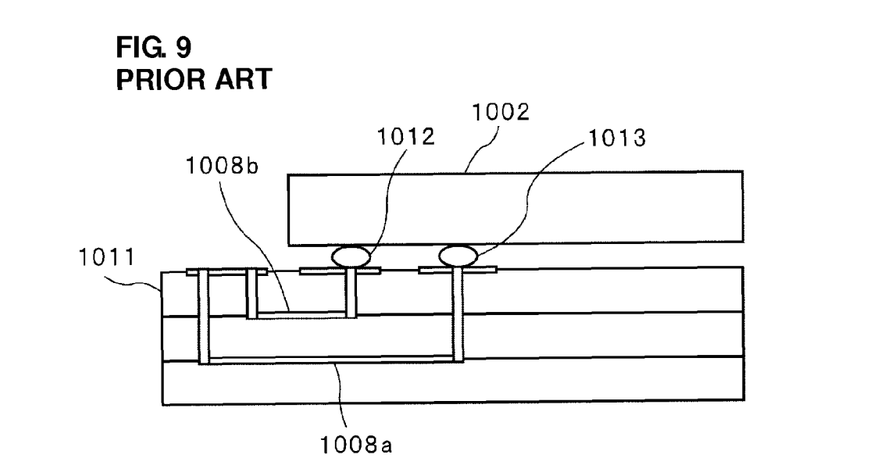
FIG. 9 is a schematic front sectional view of the duplexer of the related art.

FIG. 9 is a schematic front sectional view illustrating a specific structure of the duplexer 1001.

In the duplexer 1001, the reception side band-pass filter 1002 defined by the elastic wave filter chip is mounted on a laminated substrate 1011 by a flip-chip bonding method using bumps 1012 and 1013. A coil pattern 1008a of the inductance element 1008 is provided in the laminated substrate 1011.

Figure 10:
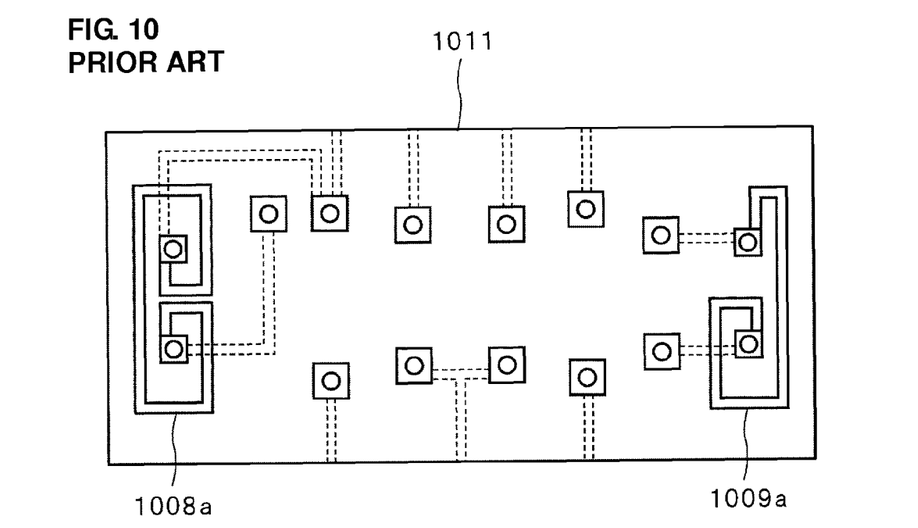
FIG. 10 is a schematic plan view for explaining coil patterns formed in a laminated substrate of the duplexer of the related art.

On the other hand, FIG. 10 is a sectional plan view schematically illustrating the electrode structure in the laminated substrate 1011 at a height level at which the inductance element 1008 is provided. The coil pattern 1008a and a coil pattern 1009a of the inductance elements 1008 and 1009, respectively, are provided in a plane at this height level. Coil patterns 1008b and 1009b are provided at a height level different from that at which the coil patterns 1008a and 1009a are provided. The coil pattern 1008a and the coil pattern 1008b are connected by a via-hole conductor. The coil patterns 1009a and 1009b are connected by a via-hole conductor. The inductance element 1005 and the capacitor 1007 are provided outside of the laminated substrate as external elements.

In a duplexer 1001 described in Japanese Unexamined Patent Application Publication No. 2003-332885, a plurality of inductance elements 1008 and 1009 are included in a laminated substrate 1011. Therefore, the size of the duplexer 1001 is reduced by mounting a reception side band-pass filter 1002 and a transmission side band-pass filter 1003, both of which are defined by elastic wave filter chips, by a flip-chip bonding method.

However, it is desirable for the size of an electronic component for a cellular phone, such as the duplexer 1001, to be further reduced, especially in thickness. When an inductor is included in a laminated substrate, a larger inductance can be obtained by, for example, electrically connecting a plurality of coil patterns provided at a plurality of height levels using a via-hole conductor and thereby increasing the number of turns of the coil patterns. However, when coil patterns are formed at a plurality of height levels, the thickness of the laminated substrate increases, making it difficult to reduce the thickness thereof.

SUMMARY OF THE INVENTION

To overcome the problems described above, preferred embodiments of the present invention provide an elastic wave filter device in which an elastic wave filter chip is flip-chip bonded onto a laminated substrate and that obtains a sufficiently large inductance without increasing the thickness of the laminated substrate.

An elastic wave filter device according to a preferred embodiment of the present invention includes a laminated substrate having an upper surface and a lower surface, an elastic wave filter chip mounted on the upper surface of the laminated substrate by flip-chip bonding, and first and second inductance elements provided in the laminated substrate. The first inductance element includes a first coil pattern arranged in a plane at a certain height level in the laminated substrate. The second inductance element includes a second coil pattern provided in the plane at the same or substantially the same height level as that of the first coil pattern. The second coil pattern is arranged in the plane in a region in which the first coil pattern is arranged.

The second coil pattern is preferably arranged so that the first coil pattern surrounds the second coil pattern. In this case, since the second coil pattern is surrounded by the first coil pattern, the density of a region in which the first and second coil patterns are arranged can be increased accordingly, which allows significant size reduction to be achieved.

In the region in which the first coil pattern is arranged, the first coil pattern preferably has a planar or substantially planar shape including a recess that is open in a certain direction and the second coil pattern is arranged in the recess. Arranging the second coil pattern in the recess enables the second coil pattern to be arranged in the region in which the first coil pattern is arranged, which increases the formation density of the first and second coil patterns.

The elastic wave filter device preferably further includes a third coil pattern provided in the plane. The third coil pattern is arranged on a side of the first coil pattern opposite to the direction in which the recess in the first coil pattern is open. In this case, the pattern density of the region in which the first and second coil patterns are provided is increased and, since the third coil pattern is arranged on the side opposite to the direction in which the recess is open, the formation density of the first, second, and third coil patterns is increased.

A duplexer according to a preferred embodiment of the present invention includes a laminated substrate having an upper surface and a lower surface, a first elastic wave filter chip mounted on the upper surface of the laminated substrate by flip-chip bonding and including a first pass band, a second elastic wave filter chip mounted on the upper surface of the laminated substrate by flip-chip bonding and including a second pass band extending over frequencies lower than those of the first pass band, and first and second inductance elements provided in the laminated substrate and connected to at least one of the first and second elastic wave filter chips. The first inductance element includes a first coil pattern provided in a plane at a certain height level in the laminated substrate. The second inductance element includes a second coil pattern provided in the plane in the laminated substrate. The second coil pattern is arranged in a region in which the first coil pattern is arranged. In this case, the formation density of the first and second coil patterns in the first and second inductance elements can be increased, thereby providing a duplexer including a laminated substrate in which thin first and second inductance elements having sufficiently large inductances are included.

According to a preferred embodiment of the present invention, the first elastic wave filter chip is preferably a ladder filter including at least one series-arm resonator and the second elastic wave filter chip is preferably a ladder filter including first and second parallel-arm resonators. The elastic wave filter device further includes a ground terminal provided on the lower surface of the laminated substrate. The third inductance element is connected in parallel with one of the at least one series-arm resonator in the first elastic wave filter chip. The first inductance element is connected between a ground-side end of the first parallel-arm resonator in the second elastic wave filter chip and the ground terminal. The second inductance element is connected between the second parallel-arm resonator in the second elastic wave filter chip and the ground terminal.

In another preferred embodiment of the present invention, the elastic wave filter device further includes a common electrode that is provided on the laminated substrate and to which one end of the first elastic wave filter chip and one end of the second elastic wave filter chip are commonly connected, a transmission terminal and a reception terminal provided on the lower surface of the laminated substrate, and an antenna terminal provided on the laminated substrate and connected to the common electrode. When an electrical signal flows from the reception terminal to the transmission terminal through the first inductance element, a common terminal, and the first elastic wave filter chip, at adjacent portions of any two of the first to third coil patterns, the portion of one coil pattern and the portion of the other coil pattern are parallel or substantially parallel to each other and extend in a direction perpendicular or substantially perpendicular to a line connecting the first and second elastic wave filter chips. A direction of a signal propagating through the third coil pattern is opposite to a direction of a signal propagating through the first coil pattern. In this case, not only is the formation density of the first to third coil patterns increased, thereby achieving size reduction, but also, since the direction of the signal propagating through the third coil pattern and that of a signal propagating through the first coil pattern are opposite to each other, the coupling between the first and third coil patterns is effectively reduced. Therefore, the isolation between the transmission side and the reception side can be increased.

At the adjacent portions of neighboring coil patterns, a direction of a signal propagating through the first coil pattern and a direction of a signal propagating through the second coil pattern are preferably opposite to each other. In this case, the coupling between the first and second coil patterns is effectively reduced, thereby making it possible to further increase the isolation between the transmission side and the reception side.

In an elastic wave filter device according to various preferred embodiments of the present invention, since first and second coil patterns that define first and second inductance elements, respectively, are provided in a plane at the same height level and the second coil pattern is arranged in a region in which the first coil pattern is arranged, the first and second coil patterns are densely arranged. Therefore, it is possible to form first and second inductance elements that are small but have sufficiently large inductances so as not to prevent a reduction in the thickness, which in turn makes it possible to, for example, achieve a reduction in the size of an elastic wave filter device, such as a duplexer used for the RF stage of a cellular phone or other communication device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

Figure 1:
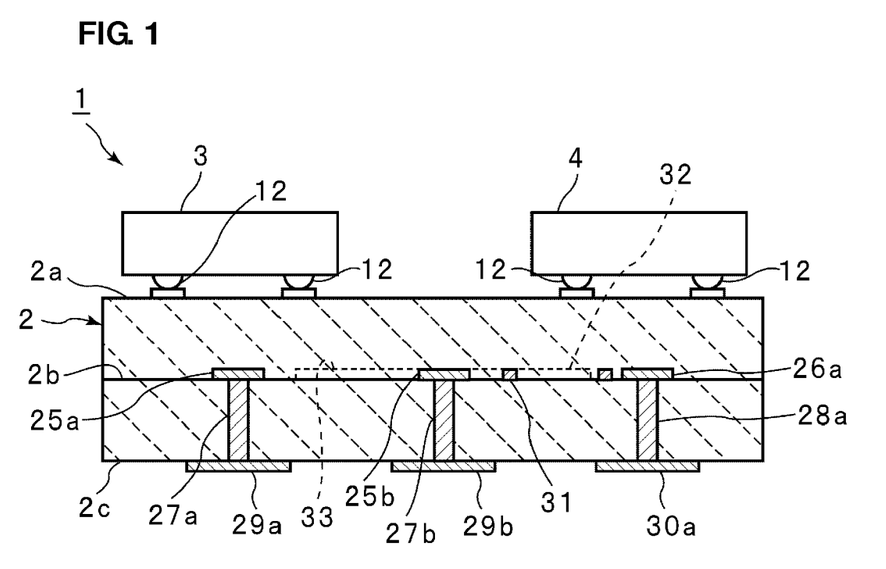
FIG. 1 is a schematic front sectional view of an elastic wave filter device according to a preferred embodiment of the present invention.

FIG. 1 is a front sectional view illustrating an elastic wave filter device according to a preferred embodiment of the present invention. An elastic wave filter device 1 according to this preferred embodiment includes a laminated substrate 2 and first and second elastic wave filter chips 3 and 4 mounted on an upper surface 2a of the laminated substrate 2 by flip-chip bonding. The elastic wave filter device 1 is a duplexer used for the RF stage of a cellular phone and includes a circuit configuration shown in FIG. 3.

Figure 3:
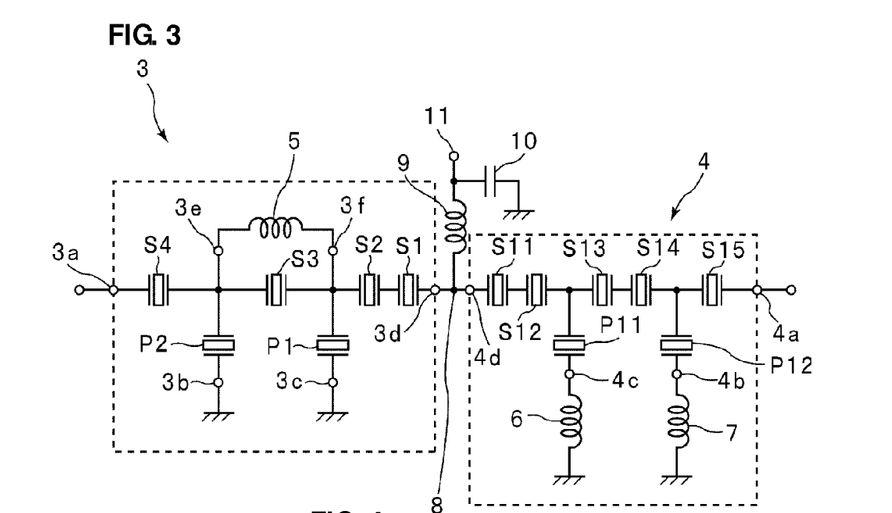
FIG. 3 is a circuit diagram explaining the circuit configuration of elastic wave filter chips according to a preferred embodiment of the present invention.
Figure 4:
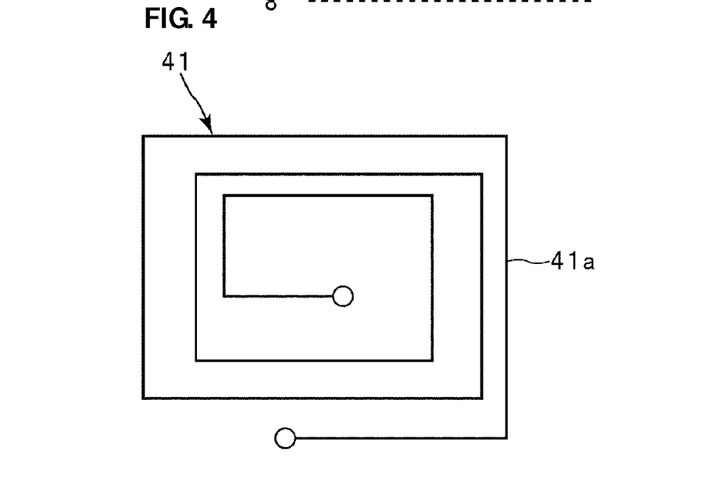
FIG. 4 is a schematic plan view of a third coil pattern in a modification of a preferred embodiment of the present invention.

As illustrated in FIG. 3, a reception side band-pass filter defined by the first elastic wave filter chip 3 and a transmission side band-pass filter defined by the second elastic wave filter chip 4 are connected to an input terminal 11. As shown in FIG. 3, the first elastic wave filter chip 3 preferably includes first to fourth series-arm resonators S1 to S4 and first and second parallel-arm resonators P1 and P2 defining a ladder filter of a reception side band-pass filter. The series-arm resonators S1 to S4 and the parallel-arm resonators P1 and P2 are all preferably defined by surface acoustic wave resonators, for example. That is, the elastic wave filter chip 3 is preferably a surface acoustic wave filter chip including a piezoelectric substrate and electrodes provided on the surface of the piezoelectric substrate, for example. The series-arm resonators S1 to S4 and the parallel-arm resonators P1 and P2 are preferably provided on a single piezoelectric substrate.

On the other hand, the elastic wave filter chip 4 preferably includes series-arm resonators S11 to S15 and parallel-arm resonators P11 and P12 defining a ladder filter.

The elastic wave filter chip 4 includes terminals 4a to 4d. First and second inductance elements 6 and 7 connect the terminals 4c and 4b, respectively, to a ground potential. The first and second inductance elements 6 and 7 are provided in the laminated substrate 2. The series-arm resonators S11 to S15 and the parallel-arm resonator P11 and P12 are also preferably defined by surface acoustic wave resonators and integrated with one another in the elastic wave filter chip 4. That is, the elastic wave filter chip 4 also includes a piezoelectric substrate, a dielectric, and electrodes provided at the interface between the piezoelectric substrate and the dielectric. The series-arm resonators S11 to S15 and the parallel-arm resonators P11 and P12 are preferably provided on a single piezoelectric substrate.

The elastic wave filter chip 3 includes terminals 3a to 3f. As described later, the terminals 3a to 3f of the elastic wave filter chip 3 are each electrically connected to any of a plurality of electrode lands on the laminated substrate 2 through bumps. As illustrated in FIG. 3, a third inductance element 5 is connected in parallel with the series-arm resonator S3. The third inductance element 5 is also provided in the laminated substrate 2 shown in FIG. 1.

As illustrated in FIG. 3, the terminal 3d and the terminal 4d are commonly connected to a node 8. An external fourth inductance element 9 is connected between the node 8 and the input terminal 11. In addition, an external capacitor 10 is connected between the input terminal 11 and the ground potential.

The elastic wave filter chips 3 and 4 described above are preferably formed in accordance with a known manufacturing method of a surface acoustic wave filter, for example. The laminated substrate 2 is preferably a ceramic multilayer substrate obtained by stacking layers of an appropriate insulating ceramic such as alumina, for example, with an inner electrode material and co-firing the layers. Because a ceramic multilayer substrate obtained by a ceramic co-firing technique includes thin insulator layers, a laminated substrate 2 having a small thickness can be easily obtained. However, the laminated substrate 2 may instead be obtained by attaching ceramic plates that have been fired in advance to each other with an adhesive. In addition, the laminated substrate 2 may have a structure in which a plurality of layers composed of an insulating material other than a ceramic, such as synthetic resin, for example, are stacked.

Figure 2A:
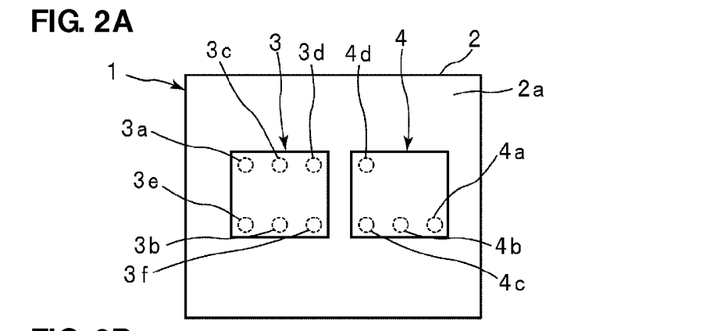
FIG. 2A is a plan view of an elastic wave filter device according to a preferred embodiment of the present invention.

FIG. 2A is a schematic plan view of the elastic wave filter device 1. The broken-line circles in FIGS. 2A to 2D correspond to the terminals 3a to 3f and the terminals 4a to 4d of the elastic wave filter chips 3 and 4 described above. More specifically, metal bumps 12 shown in FIG. 1 are attached to the terminals 3a to 3f and the terminals 4a to 4d. For the metal bumps 12, appropriate metal bumps, such as solder bumps or Au bumps, for example, may preferably be used. Since the metal bumps 12 are provided on the terminals 3a to 3f and terminals 4a to 4d, the terminals 3a to 3f and the terminals 4a to 4d can be attached to the corresponding electrode lands on the laminated substrate 2 by a flip-chip bonding method. Therefore, the elastic wave filter chips 3 and 4 can be easily and efficiently mounted on the laminated substrate 2 by reflow soldering or ultrasonic bonding, for example, and the thickness of the elastic wave filter device 1 can be reduced.

Figure 2B:
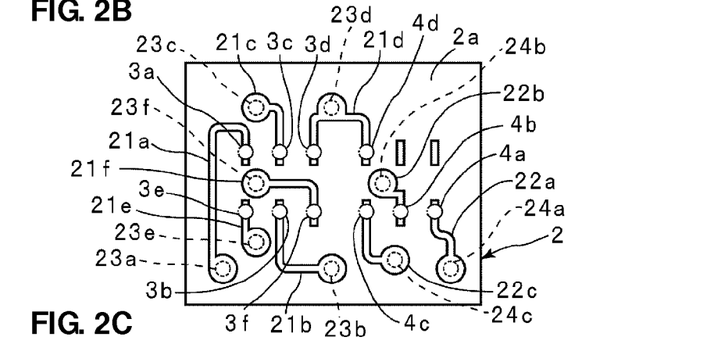
FIG. 2B is a plan view of a laminated substrate.
Figure 2C:
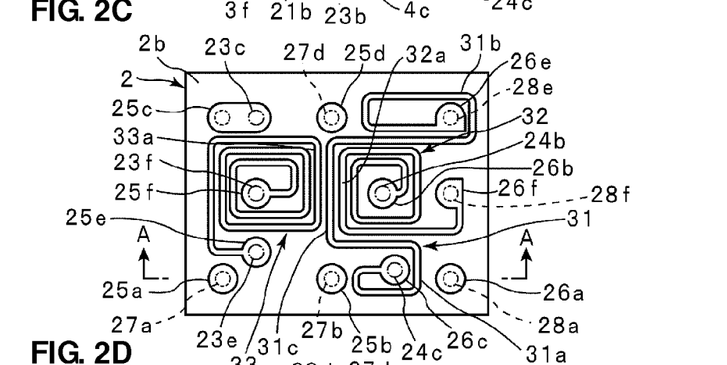
FIG. 2C is a schematic sectional plan view of the laminated substrate at a height level at which coil patterns are provided.
Figure 2D:
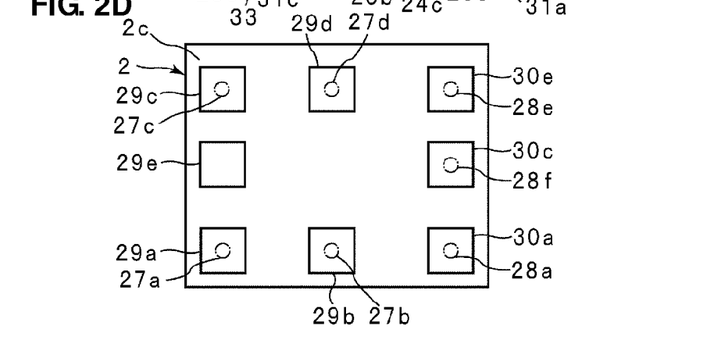
FIG. 2D is a plan view schematically illustrating the shapes of electrodes on a lower surface of the laminated substrate.

FIG. 2B is a plan view of the laminated substrate 2, and FIGS. 2C and 2D are schematic plan views showing the shapes of electrodes provided in a plane 2b, which is located at an intermediate height level in the laminated substrate 2, and a lower surface 2c. It is to be noted that, in FIG. 2D, the lower surface 2c is viewed from above as a plan view in order to illustrate electrode lands provided on the lower surface 2c. On the upper surface 2a, a plurality of electrode lands 21a to 21f and electrode lands 22a to 22d to which the terminals 3a to 3f and the terminals 4a to 4d are attached are provided.

The metal bumps 12 of the elastic wave filter chips 3 and 4 to be mounted are attached at positions corresponding to the dot-dash-line circles shown in FIG. 2B. Therefore, each circle is given a reference numeral of the terminal of the elastic wave filter chips 3 and 4 corresponding to a metal bump 12 thereof in order to clarify where the metal bumps provided on the terminals 3a to 3f and the terminals 4a to 4d are attached. For example, in the case of the terminal 3d, the metal bump provided on the terminal 3d is attached to a dot-dash-line circle 3d, and thereby the terminal 3d is electrically connected to the electrode land 21d.

In addition, via-hole conductors 23a to 23f and via-hole conductors 24a to 24c that are electrically connected to the electrode lands 21a to 21f and the electrode lands 22a to 22c are provided in the laminated substrate 2. The upper ends of the via-hole conductors 23a to 23f and the via-hole conductors 24a to 24c are electrically connected to the electrode lands 21a to 21f and the electrode lands 22a to 22c, respectively.

The lower ends of the via-hole conductors 23a to 23f extend to the plane 2b located at the intermediate height level in the laminated substrate 2 and are electrically connected to the electrode structure shown in FIG. 2C. More specifically, the via-hole conductor 23a is electrically connected to an electrode land 25a. On the other hand, the via-hole conductor 23b is electrically connected to an electrode land 25b. In addition, the via-hole conductor 23c is electrically connected to an electrode land 25c. A portion of the electrode land 25c to which the via-hole conductor 23c is electrically connected is indicated by a dot-dash line.

The via-hole conductor 23e is electrically connected to an electrode land 25e. The via-hole conductor 23f is electrically connected to an electrode land 25f. The electrode lands 25e and 25f are electrically connected to each other by a third coil pattern 33. The third coil pattern 33 includes a conductor preferably having a spiral or substantially spiral shape when viewed in plan. The electrode land 25f is located in a central portion of the spiral or substantially spiral shape and the electrode land 25e is located in a peripheral portion of the spiral or substantially spiral shape.

On the other hand, the upper ends of the via-hole conductors 24a to 24c are electrically connected to the electrode lands 22a to 22c. The lower ends of the via-hole conductors 24a to 24c are electrically connected to electrode lands 26a to 26c, respectively, shown in FIG. 2C. In the electrode lands 26b and 26c, the positions of the via-hole conductors 24b and 24c that are also located on the upper side are indicated by dot-dash lines. The electrode land 26a is electrically connected to the via-hole conductor 24a on the upper surface. However, because, on the lower side of the electrode land 26a, a via-hole conductor 28a extends downward from the plane 2b, the position of the via-hole conductor 28a is indicated by a broken line.

At the height level shown in FIG. 2C, the electrode lands 26e and 26f are provided. An electrode land 26d is not used herein as a reference numeral. This is because the terminal 4d and the terminal 3d are commonly connected as shown in FIG. 3 and are electrically connected to an electrode land 25d.

A first coil pattern 31 is connected between the electrode land 26c and the electrode land 26e in order to define the first inductance element. The coil pattern 31 includes a first spiral portion 31a and a second spiral portion 31b that are obtained by configuring a conductor in spiral or substantially spiral shapes. The first spiral portion 31a is connected to the electrode land 26c and the second spiral portion 31b is connected to the electrode land 26e. The spiral portions 31a and 31b are connected by a connecting portion 31c that extends parallel or substantially parallel to a line connecting the electrode lands 26c and 26e.

The connecting portion 31c is located near the third coil pattern 33 that defines the third inductance element. In other words, the first coil pattern 31 includes a recess that is open to a side opposite a portion in which the third coil pattern 33 is provided. In this recess, a second coil pattern 32 is arranged. The second coil pattern 32 preferably has a spiral or substantially spiral shape. One end of the second coil pattern 32 is connected to the electrode land 26b and another end is connected to the electrode land 26f.

Therefore, in this preferred embodiment, since the second coil pattern 32 that defines the second inductance element 7 is arranged in a region in which the first coil pattern 31 is arranged, the formation density of the first and second coil patterns 31 and 32 is increased. In other words, it is possible to provide more inductance components within a smaller area.

In this description, the region in which the first coil pattern 31 is arranged refers to a region that is surrounded by a plurality of lines circumscribing the first coil pattern 31.

In addition, in this preferred embodiment, a pattern portion of the second coil pattern 32 close to the connecting portion 31c preferably extends parallel or substantially parallel to the connecting portion 31c. The direction of a signal propagating through the connecting portion 31c of the first coil pattern 31 is preferably opposite to that of a signal propagating through a pattern portion 32a, which extends parallel or substantially parallel to the connecting portion 31, of the second coil pattern 32. Therefore, a magnetic flux caused by the first coil pattern 31 and a magnetic flux caused by the second coil pattern 32 on the transmission side cancel each other out on the reception side, which improves the isolation characteristics.

In a similar manner, a pattern portion 33a, which is close to the connecting portion 31c of the first coil pattern 31, of the third coil pattern 33 also preferably extends parallel or substantially parallel to the connecting portion 31c. Thus, the third coil pattern 33 can be arranged close to the first coil pattern 31. Therefore, it is possible, in addition to the first and second coil patterns 31 and 32, to arrange the third coil pattern 33 with high density.

In addition, the direction of a signal propagating through the pattern portion 33a of the third coil pattern 33 is preferably opposite to that of the signal propagating through the connecting portion 31c. This also improves the isolation between the reception side and the transmission side.

FIG. 1 is a sectional view of a portion in FIG. 2C taken along line A-A.

As illustrated in FIGS. 2C and 2D, rectangular or substantially rectangular electrode lands 29a to 29d, a dummy electrode land 29e, and electrode lands 30a, 30c, and 30e are provided on the lower surface 2c of the laminated substrate 2.

The electrode lands 29a to 29d are electrically connected to the electrode lands 25a to 25d, respectively, by via-hole conductors 27a to 27d. In addition, the electrode lands 30a, 30c, and 30e are electrically connected to the electrode lands 26a, 26f, and 26e, respectively, by the via-hole conductors 28a, 28f, and 28e. The electrode land 29d corresponds to the node 8. The inductance element 9 shown in FIG. 3 is connected to the node 8 at the outside and the node 8 is electrically connected to the input terminal 11 through the inductance element 9.

The capacitor 10 shown in FIG. 3 is connected to another end of the inductance element 9, which is connected to the electrode land 29d. The capacitor 10 is connected to the laminated substrate 2 at the outside.

In addition, the electrode land 29a defines a reception terminal, and the electrode land 30a defines a transmission terminal.

The electrode lands 29b, 29c, 30c, and 30e are connected to the ground potential.

As described above, in the elastic wave filter device 1 according to this preferred embodiment, the first to third coil patterns 31 to 33 are provided in the plane 2b located at an intermediate height level in the laminated substrate 2. The main portions of the first to third inductance elements are defined by the first to third coil patterns 31 to 33, respectively. The first and second inductance elements 6 and 7 and the third inductance element 5 include the coil patterns thereof only in the plane 2b and include no coil patterns on a surface at any other height level.

A plurality of the electrode lands 21e and 21f, 22b, and 22c on the laminated substrate 2 are inductance components connected to the third, second, and first coil patterns, respectively. These electrode lands are not included in the coil patterns.

Therefore, the thickness of the laminated substrate 2 can be significantly reduced. Furthermore, since the first to third coil patterns 31 to 33 are arranged as described above, the formation density is increased, which enables the inclusion of the first to third inductance elements having sufficiently large inductances. Thus, the size of the elastic wave filter device 1 can be significantly reduced.

Next, it is explained with reference to FIGS. 4 to 7 that isolation is improved in this preferred embodiment because the direction of the signal propagating through the pattern portion 33a of the third coil pattern 33 is opposite to that of the signal propagating through the connecting portion 31c of the first coil pattern 31.

The elastic wave filter device 1 according to the preferred embodiment described above was fabricated so that the pass band of the first elastic wave filter chip 3, which defines a reception side filter, was about 2,110 MHz to about 2,170 MHz and that of the second elastic wave filter chip 4, which defines the transmission side filter, was about 1,920 MHz to about 1,980 MHz. For comparison, a modified elastic wave filter device was also fabricated in substantially the same manner as in the preferred embodiment described above except for, as illustrated in FIG. 4, providing a coil pattern having an inverted shape of the third coil pattern 33, which defines the third inductance element, of the above preferred embodiment shown in FIG. 2C. In this modified elastic wave filter device, the direction of a signal propagating through a pattern portion 41a of a third coil pattern 41 shown in FIG. 4, that is, a pattern portion adjacent to the connecting portion 31c of the first coil pattern 31, was the same as that of the signal propagating through the connecting portion 31c.

Figure 5:
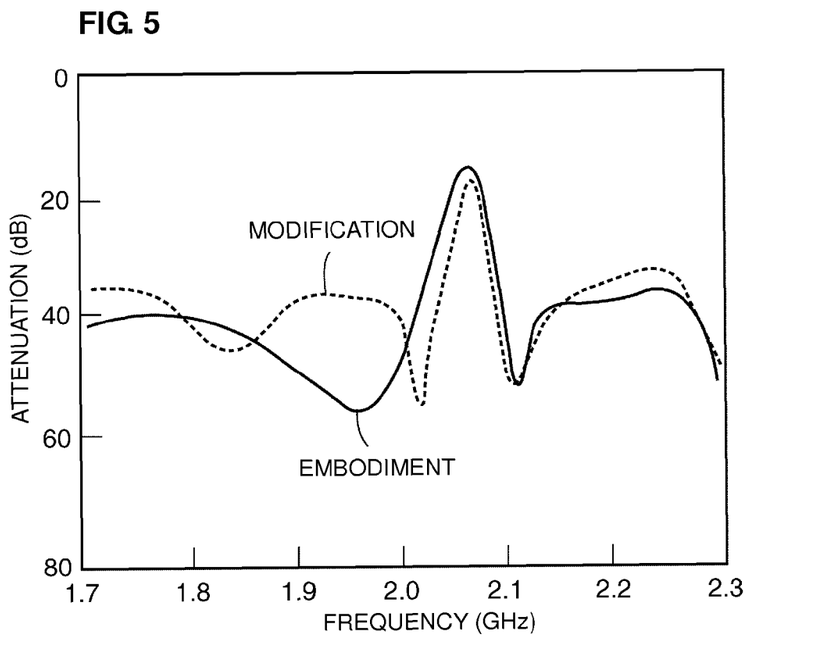
FIG. 5 is a graph illustrating the isolation characteristics of elastic wave filter devices according to a preferred embodiment and a modification of a preferred embodiment of the present invention.

FIG. 5 is a graph showing the isolation characteristics of duplexers according to the preferred embodiment described above and the modification of the preferred embodiment. The solid line indicates the result of the preferred embodiment and the broken line indicates the result of the modification. The attenuation-frequency characteristics of the transmission characteristics between the reception terminal and the transmission terminal in each elastic wave filter device of the preferred embodiment and the modification are shown.

As is clear from FIG. 5, isolation in the duplexer of the modification is not sufficient in frequencies from about 1.9 GHz to about 2.05 GHz. In contrast, isolation is improved in the duplexer according to the preferred embodiment. This is because, in the modification, the directions of current flowing through portions of the first and third inductance elements adjacent to each other are the same, which increases the coupling between the portions and degrades the isolation. In contrast, in the duplexer according to the preferred embodiment, since the directions of the signal propagating through the pattern portion 33a and the connecting portion 31c are opposite to each other, the coupling between the portions is reduced and the isolation is improved.

Therefore, the first and third coil patterns 31 and 33 are preferably arranged so that the direction of the signal propagating through the connecting portion 31c of the first coil pattern 31 and that of the signal propagating through the pattern portion 33a of the third coil pattern 33 are opposite to each other as in the above-described preferred embodiment.

Figure 6:
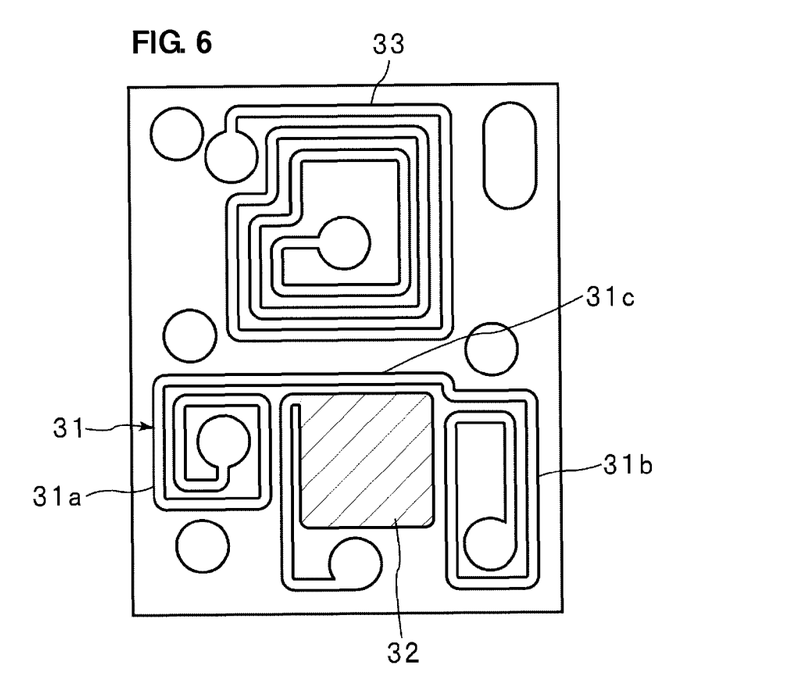
FIG. 6 is an enlarged schematic plan view illustrating the shapes of first to third coil patterns in a preferred embodiment of the present invention.

FIG. 6 is an enlarged schematic plan view illustrating a portion in which the first and second coil patterns 31 and 32 and the third coil pattern 33 are arranged in the above-described preferred embodiment. FIG. 7 is an enlarged schematic plan view illustrating a portion in which first and second coil patterns 131 and 132 are arranged in a duplexer of a comparative example. In FIG. 6, a region in which the second coil pattern 32 is arranged is schematically shown with hatching.

As illustrated in FIG. 7, in the comparative example, the first coil pattern 131 and the second coil pattern 132 are merely closely arranged. In contrast, in the above-described preferred embodiment, the second coil pattern 32 is arranged in a region in which the first coil pattern 31 is arranged as illustrated in FIG. 6. Therefore, since the first and second coil patterns 31 and 32 use the hatched region shown in FIG. 6 at the same time, the first and second coil patterns 31 and 32 can be more densely arranged. In addition, since the connecting portion 31c of the first coil pattern 31 and the pattern portion 32a of the second coil pattern 32 extend parallel or substantially parallel to each other and the directions of current flowing therethrough are opposite to each other, a magnetic flux on the reception side caused by the first and second coil patterns 31 and 32 on the transmission side is reduced.

Although the first and second elastic wave filter chips 3 and 4 are surface acoustic wave filter chips in the above-described preferred embodiment, boundary acoustic waves may be used instead of surface acoustic waves. In that case, first and second boundary acoustic wave filter chips in which a plurality of surface acoustic wave resonators are integrally provided are preferably used as the first and second boundary acoustic wave filter chips.

An elastic wave filter device according to preferred embodiments of the present invention can be applied not only to the duplexer but also to various elastic wave filter devices including a plurality of coil patterns that are provided in order to define a plurality of inductance elements in the laminated substrate and in which an elastic wave filter is mounted on the laminated substrate by flip-chip bonding. In any case, a plurality of coil patterns can be densely arranged in a laminated substrate in a plane at the same height level, which makes it possible to reduce the size of the laminated substrate as well as the size of the elastic wave filter device. In addition, a plurality of sufficiently large inductance elements can be provided in the laminated substrate.

The magnetic flux caused by a coil pattern refers to a magnetic flux caused by an alternating current flowing through the coil pattern.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave filter device comprising:
a substrate having a laminated structure including an upper surface and a lower surface;
an elastic wave filter chip mounted on the upper surface of the laminated substrate by flip-chip bonding; and
first and second inductance elements provided in the laminated substrate; wherein
the first inductance element includes a first coil pattern provided in a plane at a certain height level in the laminated substrate, the second inductance element includes a second coil pattern provided in the plane at the certain height level at which the first coil pattern is provided, and the second coil pattern is arranged in a region in which the first coil pattern is arranged in the plane;
in the region in which the first coil pattern is arranged, the first coil pattern has a planar or substantially planar shape including a substantially horseshoe shaped recess that is open in a certain direction and the second coil pattern is arranged in the recess;
a third coil pattern is provided in the plane; and
the third coil pattern is arranged on a side of the first coil pattern opposite to the direction in which the recess in the first coil pattern is open.

2. The elastic wave filter device according to claim 1, wherein the second coil pattern is arranged so that the first coil pattern encloses the second coil pattern.

3. A duplexer comprising:
a laminated substrate including an upper surface and a lower surface;
a first elastic wave filter chip mounted on the upper surface of the laminated substrate by flip-chip bonding and having a first pass band;
a second elastic wave filter chip mounted on the upper surface of the laminated substrate by flip-chip bonding and having a second pass band extending over frequencies lower than those of the first pass band; and
first and second inductance elements provided in the laminated substrate and connected to at least one of the first and second elastic wave filter chips; wherein the first inductance element includes a first coil pattern provided in a plane at a certain height level in the laminated substrate;

the second inductance element includes a second coil pattern provided in the plane at the certain height level at which the first coil pattern is provided;

the second coil pattern is arranged in a region in which the first coil pattern is arranged; and at adjacent portions of the first and second coil patterns, a direction of a signal propagating through the first coil pattern and a direction of a signal propagating through the second coil pattern are opposite to each other.

4. The elastic wave filter device according to claim 3, wherein the first elastic wave filter chip is a ladder filter including at least one series-arm resonator and the second elastic wave filter chip is a ladder filter including first and second parallel-arm resonators;

the elastic wave filter device further comprises a ground terminal provided on the lower surface of the laminated substrate;

a third inductance element is connected in parallel with one of the at least one series-arm resonator in the first elastic wave filter chip;

the first inductance element is connected between a ground-side end of the first parallel-arm resonator in the second elastic wave filter chip and the ground terminal; and the second inductance element is connected between the second parallel-arm resonator in the second elastic wave filter chip and the ground terminal.

5. The elastic wave filter device according to claim 3, further comprising:

a third coil pattern provided in the plane;

a common electrode provided in the laminated substrate and to which one end of the first elastic wave filter chip and one end of the second elastic wave filter chip are commonly connected;

a transmission terminal and a reception terminal provided on the lower surface of the laminated substrate; and an antenna terminal provided on the laminated substrate and connected to the common electrode; wherein when an electrical signal flows from the reception terminal to the transmission terminal through the first inductance element, a common electrode, and the first elastic wave filter chip, at adjacent portions of any two of the first to third coil patterns, the portion of one coil pattern and the portion of the other coil pattern are parallel or substantially parallel to each other and extend in a direction perpendicular or substantially perpendicular to a line connecting the first and second elastic wave filter chips; and a direction of a signal flowing through the third coil pattern is opposite to a direction of a signal propagating through the first coil pattern.

\* \* \* \* \*